United States Patent
Noire et al.

(10) Patent No.: US 6,867,474 B2
(45) Date of Patent: Mar. 15, 2005

(54) MONOLITHIC CIRCUIT INDUCTANCE

(75) Inventors: Aline Noire, Saint-Cyr-sur-Loire (FR); Joël Concord, Tours (FR)

(73) Assignee: STMicroelectronics S.A., Montrouge (FR)

( * ) Notice: Subject to any disclaimer, the term of this patent is extended or adjusted under 35 U.S.C. 154(b) by 156 days.

(21) Appl. No.: 10/255,307

(22) Filed: Sep. 26, 2002

(65) Prior Publication Data

US 2003/0057516 A1 Mar. 27, 2003

(30) Foreign Application Priority Data

Sep. 26, 2001 (FR) .............................. 01 12378

(51) Int. Cl.[7] .................. H01L 29/00; H01L 23/48
(52) U.S. Cl. .................................... 257/531; 257/756
(58) Field of Search ............................ 257/531, 756

(56) References Cited

U.S. PATENT DOCUMENTS 5,095,357 A * 3/1992 Andoh et al. ............... 257/379

FOREIGN PATENT DOCUMENTS

EP     1 032 001 A     8/2000

OTHER PUBLICATIONS

French Search Report from French Patent Application No. 01/12378, filed Sep. 26, 2001.
Patent Abstracts of Japan, vol. 014, No. 425 (E–0977), Sep. 13, 1990 & JP 02 163913 A (Nippon Telegr. & Teleph. Corp.).
Patent Abstracts of Japan, vol. 1996, No. 07, Jul. 31, 1996 & JP 08 064778 A (Toshiba Corp.).

* cited by examiner

*Primary Examiner*—Amir Zarabian
*Assistant Examiner*—Kiesha Rose
(74) *Attorney, Agent, or Firm*—Lisa K. Jorgenson; James H. Morris; Wolf, Greenfield & Sacks, P.C.

(57) ABSTRACT

An inductance integrated in a monolithic circuit, including a conductive spiral having an internal end connected to a connection track, the spiral and the connection track belonging to a same metallization level, in which the connection between the internal end of the spiral and the connection track is formed by a connecting track belonging to a metallization level higher than the metallization level of the spiral.

19 Claims, 2 Drawing Sheets

MONOLITHIC CIRCUIT INDUCTANCE

BACKGROUND OF THE INVENTION

1. Field of the Invention

The present invention relates to an integrated inductance in a monolithic circuit. More specifically, it relates to an integrated inductance in a monolithic circuit including a limited number of passive elements such as inductors, resistors or capacitors, and possibly a limited number of active elements, such as a protection diode.

2. Discussion of the Related Art

FIG. 1 shows a cross-section of a conventional monolithic circuit including, as an example, an inductance 10, a resistor 11, and a capacitor 12. Only three metallization levels are shown in FIG. 1. The monolithic circuit could possibly include one or several additional metallization levels.

A semiconductor substrate 13, for example, silicon, is covered with a multiple-layer of a first, second, and third insulating layers 14, 15, and 16, respectively. The first insulating layer may be formed in silicon oxide, and the second and third insulating layers 15, 16, in a material with a small dielectric coefficient, for example, benzo-cyclobutene (BCB). Substrate 13 may be formed of an isolating material, for example, glass, first insulating layer 14 being then not necessary. As an example, the second and third insulating layers 15, 16 have a thickness of approximately 10 $\mu$m, and a dielectric coefficient on the order of 2.6.

Inductance 10 includes a conductive spiral 20, for example, made of copper, belonging to the second metallization level and resting on the external surface of second insulating layer 15. Resistor 11 and capacitor 12 are formed on first insulating layer 14.

FIG. 2 shows a top view at the level of inductance 10 of the second metallization level. Spiral 20 includes a first end 21 at the spiral border, which extends in a first connection track 22 connected to a pad 23 (see FIG. 1). Pad 23 may belong to a pad assembly, formed in the third metallization level, intended, for example, for the direct assembly of the upper surface of the monolithic circuit on a printed circuit.

As illustrated in FIGS. 1 and 2, a second end 24, substantially located at the center of spiral 20, is connected to a second connection track 26, formed of a metal of the second metallization level. The connection between second end 24 and second connection track 26 is performed via a connecting track 29 formed of a metal, for example, aluminum, of the first metallization deposited on first insulating layer 14. Connecting track 29 is connected at its two ends respectively to second end 24 of spiral 20 and to second connection track 26 by two vias 27, 28 formed in second insulating layer 15.

First connection track 26 performs the connection between inductance 10 and resistor 11. First connection track 26 is connected by a via 30 crossing the second insulating layer 15 to a first terminal 31 of resistor 11. First terminal 31 is connected to a second terminal 32 of resistor 11 by a resistive strip 33, for example, tantalum nitride (TaN), deposited on first insulating layer 14 and covered with an insulating layer, for example, silicon oxide 35, covered with a silicon nitride layer 36. At the level of each terminal 31, 32 of resistor 11, metal portions 37, 38, especially aluminum, are interposed between terminals 32, 31 of resistor 11 and of first insulating layer 14. Second terminal 32 of resistor 11 is connected to a third connection track 40, including a metal strip, for example, copper, of the second metallization level, by a via 41 crossing second insulating layer 15.

Third connection track 40 connects resistor 11 to capacitor 12. Third connection track 40 is connected to a first plate 45 of capacitor 12, by a via 46 crossing second insulating layer 15. First plate 45 is for example made of tantalum nitride (TaN) covering a metal strip 47, for example, aluminum, of the first metallization level. Second plate 48 of capacitor 12 is separated from first plate 45 by a silicon nitride layer 49. Silicon nitride layer 49 covers the entire first plate 45, an insulating area 51, for example, silicon oxide, being interposed between silicon nitride layer 49 and first plate 45, except for the area where the two plates 45, 48 face each other. Second plate 48 is formed in a metal, for example, copper, of the second metallization level deposited on silicon nitride layer 49 at the level of an opening formed in second insulating layer 15. Second plate 48 extends in a fourth connection track 52, deposited on second insulating layer 15, and is connected to a pad 55.

As shown in FIG. 2, a ground plane 56 surrounds spiral 20 of inductance 10. Ground plane 56 also surrounds the first 22, second 26, third 40, and fourth 52 connection tracks. Ground plane 56 improves the quality factor of the monolithic circuit at high frequencies, since it enables obtaining interconnections of coplanar waveguide type (CPW), which enables performing impedance matchings if necessary and ensuring an electromagnetic isolation between the components and the metallizations of the monolithic circuit.

The fact that connecting track 29 is formed by a metal strip of the first metallization level has several disadvantages.

Connecting track 29 adds a stray capacitance due to the coupling with substrate 13, even when substrate 13 is glass.

Further, connecting track 29 behaves as a parasitic series resistor, which can become significant at high frequencies. A deterioration of the behavior of inductance 10 with frequency can then be acknowledged.

Further, the presence of connecting track 29 on first insulating layer 14 causes the forming, if expensive leveling steps are not carried out, of significant drops, currently called "steps", on the upper surface of second insulating layer 15. The manufacturing method of inductance 10 on the uneven upper surface of second insulating layer 15 is then more complex. Further, a significant dispersion of some properties of inductance 10, which depend on its topology, may be obtained.

To solve the stray capacitance problem, a solution consists of interposing a layer having a low dielectric coefficient between connecting track 29 and substrate 13 to draw them away from each other. For this purpose, connecting track 29 may be formed in the second metallization level, while spiral 20 is formed in the third metallization level.

However, such a configuration does not enable forming a continuous ground plane between spiral 20, then located on the third insulating layer, and tracks 22, 26, 40, and 32 of connection to other components or pads, located on the second and third insulating layers, which adversely affects the device performance, especially at high frequencies.

SUMMARY OF THE INVENTION

The present invention aims at providing an inductance 10 having improved properties, in particular at high frequencies.

It also aims at obtaining an inductance having simplified manufacturing.

To achieve these and other objects, the present invention provides an inductance integrated in a monolithic circuit, including a conductive spiral having an internal end connected to a connection track, the spiral and the connection track belonging to a same metallization level, in which the connection between the internal end of the spiral and the connection track is formed by a connecting track belonging to a metallization level higher than the metallization level of the spiral.

According to an embodiment of the present invention, the monolithic circuit includes a ground plane surrounding the spiral and the connection track and which is formed in the same metallization level.

According to an embodiment of the present invention, the connection track connects the spiral to a passive component integrated to the monolithic circuit.

According to an embodiment of the present invention, the connection track connects the spiral to a pad accessible from the outside of the monolithic circuit.

According to an embodiment of the present invention, the monolithic circuit includes at least three metallization levels, the spiral and the connection track belonging to the second metallization level, and the track for connecting to the third metallization level.

According to an embodiment of the present invention, the spiral and the connection track are covered with an insulating layer on which is formed the connecting track, the connecting track being connected to the spiral and to the connection track by two vias crossing the insulating layer.

According to an embodiment of the present invention, the spiral and the connection track are covered with an insulating layer on which is formed the connecting track, the insulating layer including two openings in which extend the two ends of the connecting track to respectively connect to the spiral and to the connection track.

The foregoing objects, features and advantages of the present invention will be discussed in detail in the following non-limiting description of specific embodiments in connection with the accompanying drawings.

DETAILED DESCRIPTION

Figure 1:
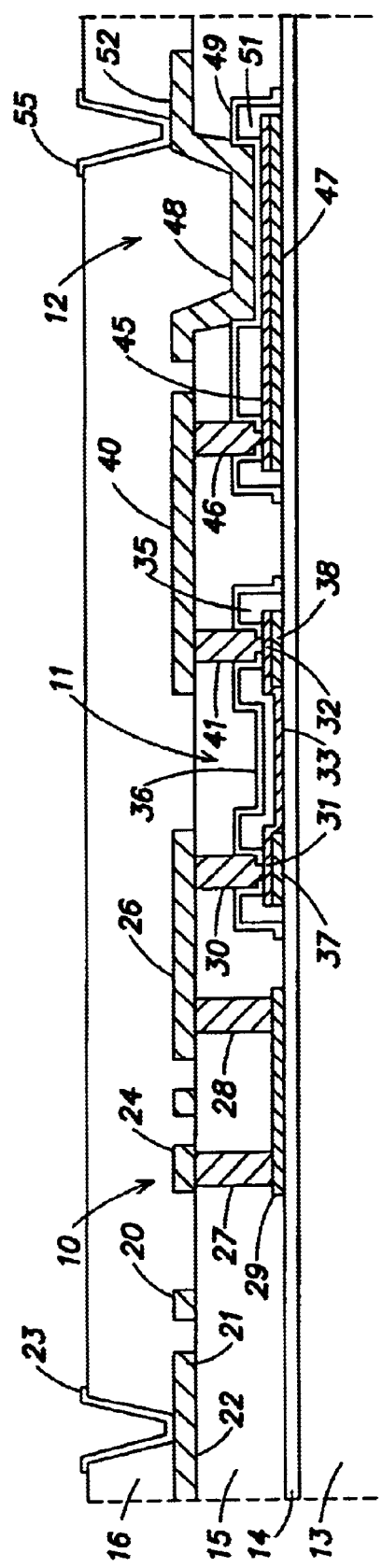
FIG. 1, previously described, shows a cross-section of a conventional monolithic circuit including an inductance, a resistor, and a capacitor.
Figure 2:
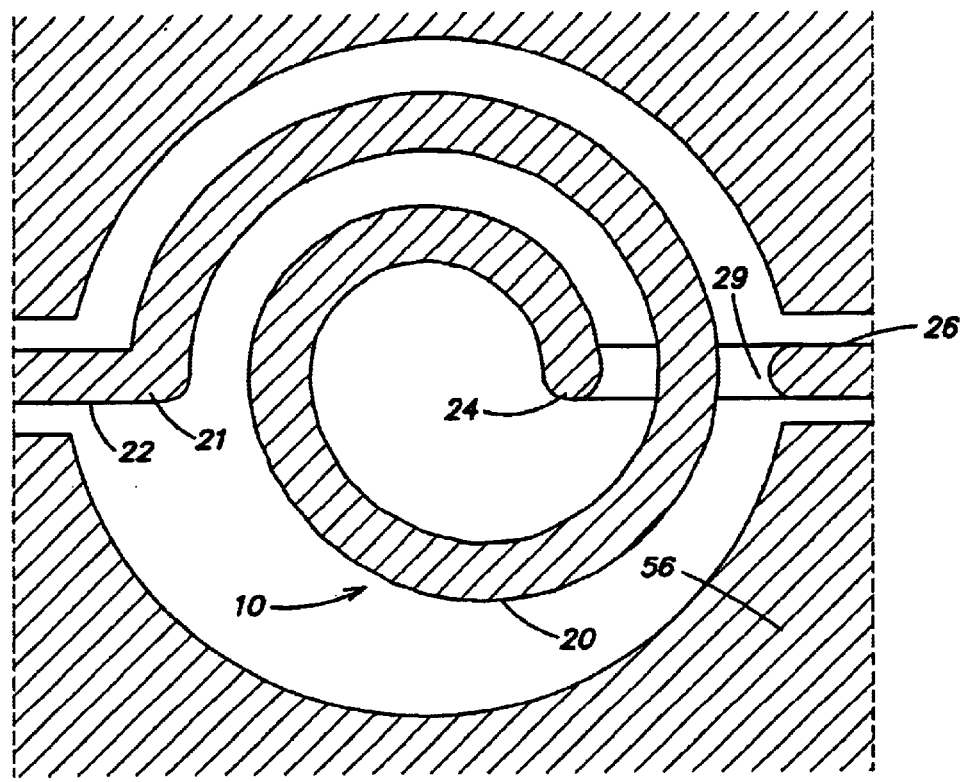
FIG. 2, previously described, shows a top view of the inductance of FIG. 1.

An embodiment of the present invention will be described in detail. It should be noted that, in the different drawings, as usual in the representation of monolithic circuits, the thicknesses and lateral dimensions of the various layers are not drawn to scale, neither within a same drawing, nor from one drawing to another, to improve the readability of the drawing. Further, the same references designate, in the different drawings, the same elements.

Figure 3:
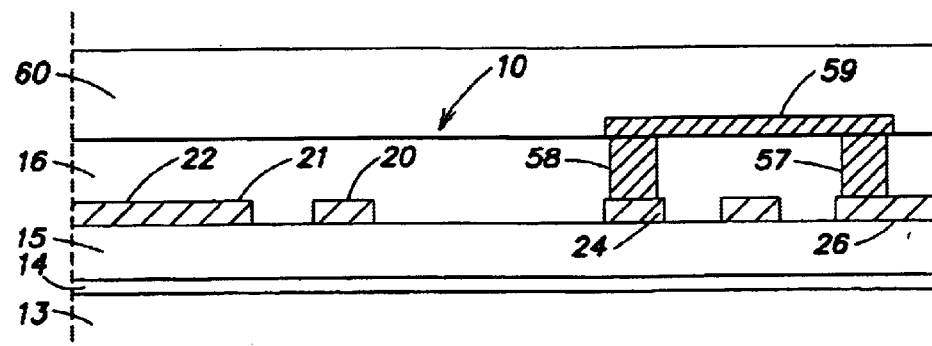
FIG. 3 shows a cross-section of a portion of a monolithic circuit including an inductance according to the present invention.

As shown in FIG. 3, the inductance according to the present invention is formed in a monolithic circuit including three metallization levels and a multiple-layer formed of four insulating layers 14, 15, 16, 60. The monolithic circuit might possibly include one or several additional metallization levels.

Inductance 10 is formed, as for a conventional monolithic circuit, of a spiral including a metal strip of the second metallization level deposited on second indulating layer 15, The second internal end 24 of spiral 20 is connected to connection track 26 via a connecting track 59. Connecting track 59 includes a metal strip of the third metallization level deposited on third insulating layer 16 and connected to its two ends respectively to internal end 24 of spiral 20 and to connection track 26, by two vias 57, 58 crossing third insulating layer 16.

Outer end 21 of spiral 20 may be connected to a contact (not shown) by a via crossing third insulating layer 16. Connection track 26 may be connected to a pad (not shown), or to another component (not shown) of the monolithic circuit.

The fact that the connecting track is formed by a metal strip of a metallization level higher than that of the spiral and of the connection tracks has many advantages.

The absence of any metal layer under the inductance enables simple forming of a second insulating layer having a substantially planar upper surface. The inductance manufacturing, for example, by deposition of a metal strip on the planar upper surface of the second insulating layer, is simplified. The inductance topology is better controlled, so that the dispersions of its properties depending on topology are reduced.

Further, the fact that the connecting track is arranged on the other side of the ground plane associated with the second metallization level with respect to the substrate makes the stray capacitance between this connecting track and the substrate negligible.

Moreover, the fact that the connecting track is formed by a metallization level higher than the first metallization level enables more easily using a metal different from aluminum which, according to current technologies, is the most currently used metal for the first metallization level. Thus, the connecting track may, for example, be made of copper, which enables then obtaining low-resistance connections. This low resistance may also be obtained by increasing the width of the connecting track, which is possible, given the negligible capacitance between the connecting track and the substrate.

The present invention thus enables generally improving the electric properties of the inductance with frequency. Indeed, for prior art inductances, quality factors at 5 GHz smaller than 50 are generally obtained, while for an inductance according to the present invention, quality factors at 5 GHz that can reach 70 or 100 are obtained.

Finally, by maintaining the inductance at the same metallization level as the connection tracks, it is possible to form a continuous ground plane surrounding the inductance and the connection tracks to improve the properties of the assembly, in particular at high frequencies.

Of course, the present invention is likely to have various alterations, modifications, and improvements which will readily occur to those skilled in the art. For example, insulating and conductive materials other than those specifically described may be selected, according to the envisaged manufacturing technologies. Further, to ensure the connection between a metal strip of a higher metallization level and a metal strip of a lower metallization level, instead of a via crossing the insulating layer separating the two metal strips, an opening may be formed in the insulating layer in which one end of the metal strip of the higher metallization level extends to connect to the metal strip of lower level.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An inductance integrated in a monolithic circuit, including a conductive spiral having an internal end connected to a connection track, the spiral and the connection track belonging to a same metallization level, wherein the connection between the internal end of the spiral and the connection track is formed by a connecting track belonging to a metallization level higher than the metallization level of the spiral, the monolithic circuit including at least three metallization levels, the spiral and the connecting track belonging to an intermediate metallization level between two metallization levels.

2. The inductance of claim 1, wherein the monolithic circuit includes a ground plane surrounding the spiral and the connection track and which is formed in the same metallization level.

3. The inductance of claim 1, wherein the connection track connects the spiral to a passive component integrated to the monolithic circuit.

4. The inductance of claim 1, wherein the connection track connects the spiral to a pad accessible from the outside of the monolithic circuit.

5. The inductance of claim 1, wherein the spiral and the connection track are covered with an insulating layer on which is formed the connecting track, the connecting track being connected to the spiral and to the connection track by two vias crossing the insulating layer.

6. The inductance of claim 1, wherein the spiral and the connection track are covered with an insulating layer on which is formed the connecting track, the insulating layer including two openings in which extend the two ends of the connecting track to respectively connect to the spiral and to the connection track.

7. The inductance of claim 1, wherein the substrate is glass.

8. An inductance integrated in a monolithic circuit including a substrate and first, second and third metallization levels formed on the substrate, the inductance comprising:
   a spiral track and a connection track formed in the second metallization level, the spiral track having an internal end; and
   a connecting track formed in the third metallization level and interconnecting the internal end of the spiral track and the connection track, wherein the connecting track is farther from the substrate than the spiral track.

9. An inductance as defined in claim 8, wherein the second and third metallization levels are separated by an insulating layer and wherein vias interconnect the connecting track to the spiral track and to the connection track through the insulating layer.

10. An inductance as defined in claim 8, wherein the second and third metallization levels are separated by an insulating layer and wherein the connecting track is interconnected to the spiral track and to the connection track by conductively coated holes extending through the insulating layer.

11. An inductance as defined in claim 8, further comprising a ground plane in the second metallization level surrounding the spiral track and the connection track.

12. An inductance as defined in claim 8, wherein the connection track connects the spiral track to a passive component in the integrated circuit.

13. An inductance as defined in claim 8, wherein the connection track connects the spiral track to an external pad of the integrated circuit.

14. An inductance as defined in claim 8, wherein the substrate comprises glass.

15. A monolithic integrated circuit comprising:
   a substrate;
   first, second and third metallization levels formed on the substrate, the third metallization level being farther from the substrate than the second metallization level;
   a spiral track having an internal end formed in the second metallization level;
   a connection track formed in the second metallization level; and
   a connecting track formed in the third metallization level and interconnecting the internal end of the spiral track to the connection track.

16. A monolithic integrated circuit as defined in claim 15, wherein the connecting track is interconnected to the internal end of the spiral track and to the connection track by vias extending through an insulating layer between the second and third metallization levels.

17. A monolithic integrated circuit as defined in claim 15, wherein the second and third metallization levels are separated by an insulating layer and wherein the connecting track is interconnected to the internal end of the spiral track and to the connection track by conductively coated holes extending through the insulating layer.

18. A monolithic integrated circuit as defined in claim 15, further comprising a ground plane in the second metallization level surrounding the spiral track and the connection track.

19. A monolithic integrated circuit as defined in claim 15, wherein the substrate comprises glass.

* * * * *